(12) United States Patent
Lee

(10) Patent No.: US 6,845,010 B2
(45) Date of Patent: Jan. 18, 2005

(54) HIGH PERFORMANCE HEAT SINK CONFIGURATIONS FOR USE IN HIGH DENSITY PACKAGING APPLICATIONS

(75) Inventor: Seri Lee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 10/388,856

(22) Filed: Mar. 14, 2003

(65) Prior Publication Data

US 2003/0189813 A1 Oct. 9, 2003

Related U.S. Application Data

(63) Continuation of application No. 09/766,757, filed on Jan. 22, 2001, now Pat. No. 6,535,385, which is a continuation-in-part of application No. 09/716,510, filed on Nov. 20, 2000, now Pat. No. 6,633,484.

(51) Int. Cl.[7] .................................................. H05K 7/20
(52) U.S. Cl. ..................... 361/697; 165/80.3; 165/122; 165/104.33; 165/185; 257/722; 361/704; 361/710; 361/700; 361/703; 174/15.2
(58) Field of Search .................. 165/80.2, 80.3, 165/121–125, 104.33, 185; 174/15.2, 16.3; 257/706–707, 712–715, 721–722; 361/688, 690, 694–695, 697, 699, 700, 704, 707, 710, 719–721; D13/179

(56) References Cited

U.S. PATENT DOCUMENTS

| | | | |
|---|---|---|---|
| 898,107 A | 9/1908 | Hill | |
| 2,337,294 A | 12/1943 | Cooper | 219/10 |
| 3,182,114 A | 5/1965 | Burgess et al. | 174/15 |
| 3,187,082 A | 6/1965 | Allison | 174/35 |
| 3,239,003 A | 3/1966 | Boudette et al. | 165/185 |
| 3,466,909 A | 9/1969 | Weber | 72/68 |
| 3,779,291 A | 12/1973 | Yeo | 140/147 |
| 4,354,729 A | 10/1982 | Grabbe et al. | 339/258 R |
| 4,520,541 A | 6/1985 | Miki et al. | 29/156.8 |
| 4,557,225 A | 12/1985 | Sagues et al. | 128/41.31 |
| 4,645,279 A | 2/1987 | Grabbe et al. | 339/17 CF |
| 4,688,077 A | 8/1987 | Wakabayashi et al. | 357/81 |
| 4,699,593 A | 10/1987 | Grabbe et al. | 439/71 |
| 4,726,739 A | 2/1988 | Saitou et al. | 417/286 |
| 4,733,293 A | 3/1988 | Gabuzda | 357/81 |
| 4,940,432 A | 7/1990 | Consoli et al. | 439/862 |

(List continued on next page.)

FOREIGN PATENT DOCUMENTS

| | | |
|---|---|---|
| EP | 0856888 | 8/1998 |
| EP | 0860874 | 8/1998 |
| EP | 1081760 | 3/2001 |

(List continued on next page.)

OTHER PUBLICATIONS

"High–Performance Fin Design For A Fan–Mounted Heat Sink", *IBM Technical Disclosure Bulletin,* IBM Corp. New York, vol. 37, NR.11 ISSN: 0018–8689, 417–418.

(List continued on next page.)

*Primary Examiner*—Gregory D Thompson
(74) *Attorney, Agent, or Firm*—Schwegman, Lundberg, Woessner & Kluth, P.A.

(57) ABSTRACT

An enhanced heat dissipation device to extract heat from an integrated circuit device includes a thermally conductive core having upper and lower outer surface areas. The device further includes a first array of radially extending pin fin structures. The first array is thermally coupled to the upper surface area such that a cooling medium introduced around the core and the first array creates an omni-directional flow around the first array and the core to enhance heat dissipation from the integrated circuit device. The core including the first array and the lower surface area are of sufficient size to allow components on a motherboard to encroach onto the integrated circuit device when the heat dissipation device is mounted onto the integrated circuit device.

12 Claims, 12 Drawing Sheets

U.S. PATENT DOCUMENTS

| | | | |
|---|---|---|---|
| 4,959,029 A | 9/1990 | Grabbe | 439/862 |
| 4,997,034 A | 3/1991 | Steffen et al. | 165/104.34 |
| 5,035,629 A | 7/1991 | Matsuoka | 439/70 |
| 5,132,780 A | 7/1992 | Higgins, III | 357/81 |
| 5,132,875 A | 7/1992 | Plesinger | 361/386 |
| 5,286,208 A | 2/1994 | Matsuoka | 439/72 |
| 5,299,090 A | 3/1994 | Brady et al. | 361/703 |
| 5,375,652 A | 12/1994 | Matsunaga et al. | 165/80.3 |
| 5,437,327 A | 8/1995 | Chiou | 165/122 |
| 5,505,257 A | 4/1996 | Goetz, Jr. | 165/183 |
| 5,545,045 A | 8/1996 | Wakamatsu | 439/70 |
| 5,567,983 A | 10/1996 | Hirano et al. | 257/722 |
| 5,597,034 A | 1/1997 | Barker, III et al. | 165/80.3 |
| 5,704,416 A | 1/1998 | Larson et al. | 165/104.33 |
| 5,761,044 A | 6/1998 | Nakajima | 361/719 |
| 5,785,116 A | 7/1998 | Wagner | 165/80.3 |
| 5,794,685 A | 8/1998 | Dean | 165/121 |
| 5,800,184 A | 9/1998 | Lopergolo et al. | 439/66 |
| 6,152,214 A | 11/2000 | Wagner | 165/121 |
| 6,176,299 B1 | 1/2001 | Hanzlik et al. | 165/80.3 |
| 6,189,601 B1 | 2/2001 | Goodman et al. | 165/80.3 |
| 6,196,300 B1 | 3/2001 | Checchetti | 165/80.3 |
| 6,208,511 B1 | 3/2001 | Bortolini et al. | 361/698 |
| 6,219,239 B1 | 4/2001 | Mellberg et al. | 361/704 |
| 6,244,331 B1 | 6/2001 | Budelman | 165/80.3 |
| 6,360,816 B1 | 3/2002 | Wagner | 361/697 |
| 6,374,490 B1 | 4/2002 | Miyahara | 29/890.03 |
| 6,411,510 B2 | 6/2002 | Sasa et al. | 361/697 |
| 6,419,007 B1 | 7/2002 | Ogawara et al. | 165/80.3 |
| 6,535,385 B2 * | 3/2003 | Lee | 361/697 |
| 2001/0014011 A1 | 8/2001 | Sasa et al. | 361/704 |
| 2002/0017378 A1 | 2/2002 | Hu | 165/80.3 |
| 2002/0018336 A1 | 2/2002 | Liang | 361/697 |
| 2002/0046826 A1 | 4/2002 | Kao | 165/104.33 |

FOREIGN PATENT DOCUMENTS

| | | |
|---|---|---|
| JP | 04-294570 | 10/1992 |
| JP | 406077677 A | 3/1994 |
| JP | 2001/102504 | 4/2001 |

OTHER PUBLICATIONS

Schnurer, G, "Coole Typen Neue CPU–Kuehler Von Madex Und Titan", *CT Magazin Fuer Computer Technik,* Verlag Heinz Heisé GMBH, Hannover, DE NR.11,82–83.

Wagner, G R., "Optimization of the Arcticooler for Lowest Thermal Resistance in a minimum Volume", *ITHERM 2000 7TH Intersociety Conference on Thermal and Thermomechanical Phenomena in Electronic Systems,* Intersociety Conference on Thermal and Thermomechanical Phenomena in Electronic Systems, NY, IEEE, US ISBN: 0–7803–5913–5, (May 2000).

Cotton, Martin, "Microfeatures & Embedded Coaxial Technology", *Electronic Circuits World Convention 8*, (Sept 8, 1999), 6 p.

* cited by examiner

HIGH PERFORMANCE HEAT SINK CONFIGURATIONS FOR USE IN HIGH DENSITY PACKAGING APPLICATIONS

This application is a continuation of U.S. patent application Ser. No. 09/766,757, filed Jan. 22, 2001, now issued as U.S. Pat. No. 6,535,385, which is a continuation-in-part of U.S. patent application Ser. No. 09/716,510, filed Nov. 20, 2000, now issued as U.S. Pat. No. 6,633,484, both of which are incorporated herein by reference.

TECHNICAL FIELD

This invention relates generally to a heat dissipation system and method for an integrated circuit assembly, and more particularly to a system and method of dissipating heat from an integrated circuit device.

BACKGROUND

Integrated circuit devices, microprocessors and other related computer components are becoming more and more powerful with increasing capabilities, resulting in increasing packaging densities and amounts of heat generated from these components. Packaged units and integrated circuit device sizes of these components are decreasing or remaining the same, but the amount of heat energy given off by these components per unit volume, mass, surface area or any other such metric is increasing. In current packaging techniques, heat sinks typically consist of a flat base plate, which is mounted onto the integrated circuit device on one side. The heat sinks further include an array of fins running perpendicular to the flat base plate on the other side. Generally, the integrated circuit devices (which are the heat sources) have a significantly smaller footprint size than the flat base plate of the heat sink. The flat base plate of the heat sink has a large footprint. The large footprint requires more motherboard real estate than the integrated circuit device in contact therewith. The larger size of the base plate causes the outermost part of the base plate that is not directly in contact with the integrated circuit device to have a significantly lower temperature than the part of the base plate that is directly in contact with the integrated circuit device. This results in the outermost part of the heat sink that is not directly in contact with the integrated circuit being less efficient in dissipating heat into the cooling air.

Furthermore, as computer-related equipment becomes more powerful, more components are being placed inside the equipment and on the motherboard which further requires more motherboard real estate. In addition, the base plate of prior art heat sink designs is at the same level as the integrated circuit device to which it is attached. Consequently, the flat base plate configuration of the heat sink generally ends up consuming more motherboard real estate than the integrated circuit device on which it is mounted. As a result, the larger footprint size of the base plate prevents other motherboard components, such as low-cost capacitors, from encroaching around or on the microprocessor. Thus, the large amounts of heat produced by many of such integrated circuits, and the increasing demand for motherboard real estate need to be taken into consideration when designing the integrated circuit mounting and packaging devices.

For the reasons stated above, and for other reasons stated below which will become apparent to those skilled in the art upon reading and understanding the present specification, there is a need in the art for an enhanced heat dissipation device and method that conserve motherboard real estate and allow electronic components to encroach on and around the microprocessor.

DETAILED DESCRIPTION

Figure 1:
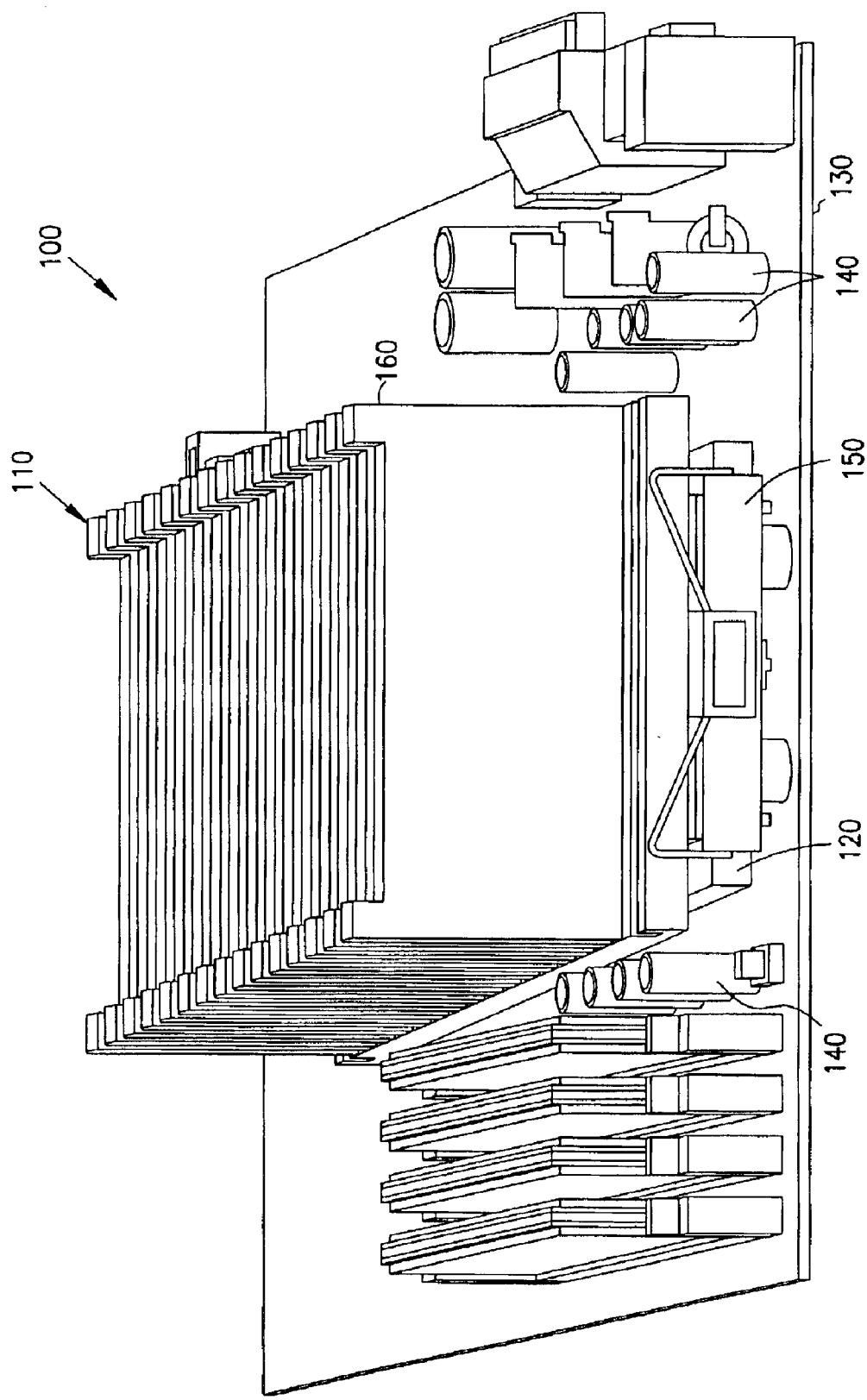
FIG. 1 is an isometric view of a prior art heat sink attached to a microprocessor on an assembled motherboard.

In the following detailed description of the embodiments, reference is made to the accompanying drawings that illustrate embodiments of the present invention and its practice. In the drawings, like numerals describe substantially similar components throughout the several views. These embodiments are described in sufficient detail to enable those skilled in the art to practice the embodiments of the invention. Other embodiments may be utilized and structural, logical, and electrical changes may be made without departing from the scope of the present disclosure. Moreover, it is to be understood that the various embodiments of the invention, although different, are not necessarily mutually exclusive. For example, a particular feature, structure, or characteristic described in one embodiment may be included in other embodiments. The following detailed description is, therefore, not to be taken in a limiting sense, and the scope of the embodiments of the present invention is defined only by the appended claims, along with the full scope of equivalents to which such claims are entitled.

This document describes, among other things, an enhanced heat dissipation device that allows electronic components to encroach around and on a microprocessor while maintaining high performance and cost effectiveness by leveraging currently enabled high-volume manufacturing techniques.

FIG. 1 shows an isometric view 100 of a prior art heat sink 110 mounted on a microprocessor 120 of an assembled motherboard 130. Also, shown in FIG. 1 are low-cost capacitors 140 mounted around the heat sink 110 and on the motherboard 130.

The prior art heat sink 100 has a flat base plate 150 including an array of fins 160 extending perpendicularly away from the flat base plate 150. This configuration of the heat sink 110 dictates the use of the flat base plate 110, with the array of fins 160 for dissipating heat from the microprocessor 120. Increasing the heat dissipation using the prior art heat sink 110 shown in FIG. 1, generally requires enlarging the surface area of the flat base plate 150 and/or the array of fins 160. This in turn results in consuming more motherboard real estate. Generally, the microprocessor 120 (which is the heat source) has a smaller footprint size than the flat base plate 150 configuration of the heat sink 110 shown in FIG. 1. A larger footprint size of the flat base plate 150 can cause the outermost part of the flat base plate 150 (the portion that is not directly in contact with the integrated circuit device) to have a significantly lower temperature than the part of the flat base plate 150 that is directly in contact with the integrated circuit device. Consequently, the prior art heat sink 110 with the larger flat base plate 150 is not effective in dissipating heat from the integrated circuit device. Furthermore, the packaged units and integrated circuit device sizes are decreasing, while the amount of heat generated by these components is increasing. The prior art heat sink 110 configuration dictates that the array of fins 160 extend to the edge of the flat base plate 150 to extract heat from the integrated circuit device. Also, the prior art heat sink 110 requires increasing the size of the array of fins 160 to increase the heat dissipation. In order to enlarge the fins 120 laterally, the flat base plate 150 has to increase in size. Enlarging the flat base plate 150 consumes more motherboard real estate. Consuming more motherboard real estate is generally not a viable option in an environment where system packaging densities are increasing with each successive, higher performance, integrated circuit device generation. Also, the prior art heat sink 110 is at the same level as the integrated circuit device on which it is mounted. It can be seen in FIG. 1, that the flat base plate 150 configuration of the prior art heat sink 110 mounted on the microprocessor 120 generally prevents other motherboard components, such as low-cost capacitors 140, from encroaching around the microprocessor 120.

Figure 2:
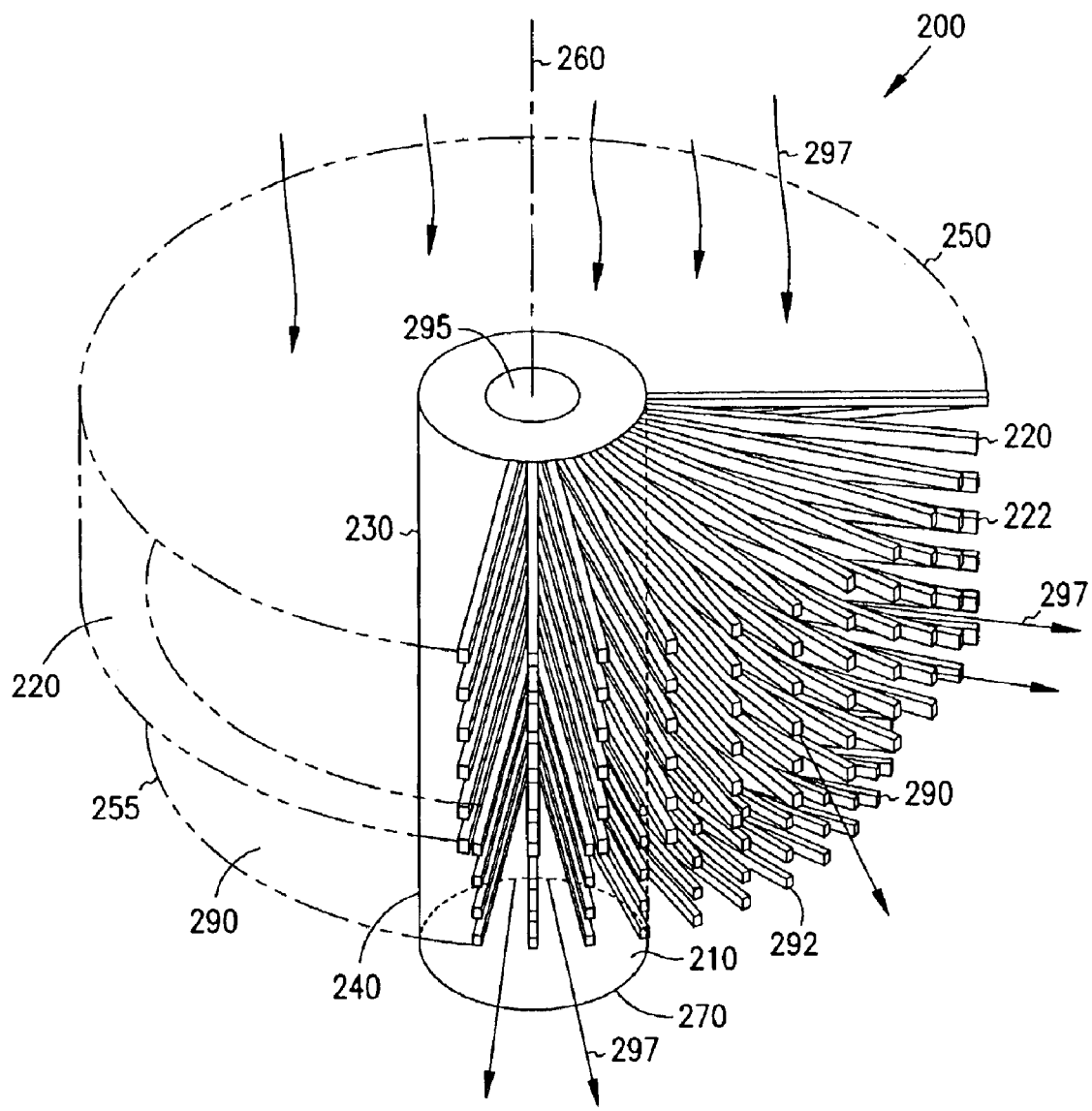
FIG. 2 is an isometric view of one embodiment of an enhanced heat dissipation device according to the present invention.

FIG. 2 is an isometric view of one embodiment of the enhanced heat dissipation device 200 according to the present invention. Shown in FIG. 2 is the enhanced heat dissipation device 200 including a thermally conductive core 210, and a first array 220 of radially extending pin fin structures 222. The pin structures 222 can have cross-sectional shapes such as round, square, rectangle, elliptical, conical or any other suitable shape for dissipating heat. Also, shown in FIG. 2 is the core 210 having upper and lower outer surface areas 230 and 240. The first array 220 is thermally coupled to the upper surface area 230 of the core 210 such that a cooling medium such as air introduced around the upper and lower surface areas 230 and 240 of the core 210 and the first array 220 creates an omni-directional flow around the core 210 and the first array to enhance heat dissipation from the heat sink 200. FIG. 2 further shows an optional second array 290 of radially extending pin fin structures 292 thermally coupled to the lower surface area 240 of the core 210 such that the cooling medium introduced around the second array also creates an omni-directional flow around the second array 290. Each of the pin structures 222 and 292 can have a head to create a higher turbulent flow around the first and second arrays 220 and 290.

The core 210 has an axis 260. In some embodiments, the upper and lower surface areas 230 and 240 are parallel to the axis 260. The core 260 further has a base 270. In some embodiments, the base 270 is disposed in such a way that it is in close proximity to the lower surface area 240 and perpendicular to the axis 260. The upper and lower surface areas 230 and 240 can be concentric to the axis 260.

The first array 220 is thermally coupled to the upper surface area 230 such that components can be mounted around and in close proximity to the lower surface area 240 and below the first array 220 when the device 200 is mounted onto an integrated circuit device. In some embodiments, the components can encroach onto the integrated circuit device without mechanically interfering with the device 200.

The core 210 can be a solid body. The solid body can be cylindrical, conical, square, rectangular, or any other similar shape that facilitates in mounting onto the integrated circuit device and in attaching the first array 220 to the upper surface area 230. The core 210 can include heat transport mediums such as one or more heat pipes, a liquid, a thermo-siphon, or other such heat transport medium that enhance heat dissipation from the integrated circuit device.

In some embodiments, the first array 220 has a first outer diameter 250 (refer also to FIG. 12) and the second array 290 has a second outer diameter 255. The second outer diameter 255 is less than the first outer diameter 250. The first array 220 has a first depth (refer to FIG. 12) and the second array 290 has a second depth. The first and second outer diameters 250 and 255 including the first and second depths are of sufficient size to allow components to be mounted around and in close proximity to the integrated circuit device when the device is mounted on the integrated circuit device.

Referring again to FIG. 2, the second array 290 is thermally coupled to the lower core area 240 of the core 210 such that the cooling medium introduced around the first and second arrays 220 and 290 creates an omni-directional flow around the upper and lower surface areas 230 and 240 of the core 210 and the first and second arrays 220 and 290 to enhance heat dissipation from the heat sink 200. The device 200, including the core 210 and the first and second arrays 220 and 290, can be made from materials such as aluminum, copper, or any other materials that are capable of dissipating heat away from the integrated circuit device. The first and second arrays 220 and 290 can be formed to have outer shapes such as circular, square, rectangular, elliptical, conical or any other shape suitable for allowing components to encroach around and in close proximity to the first and second arrays 220 and 290.

Figure 3:
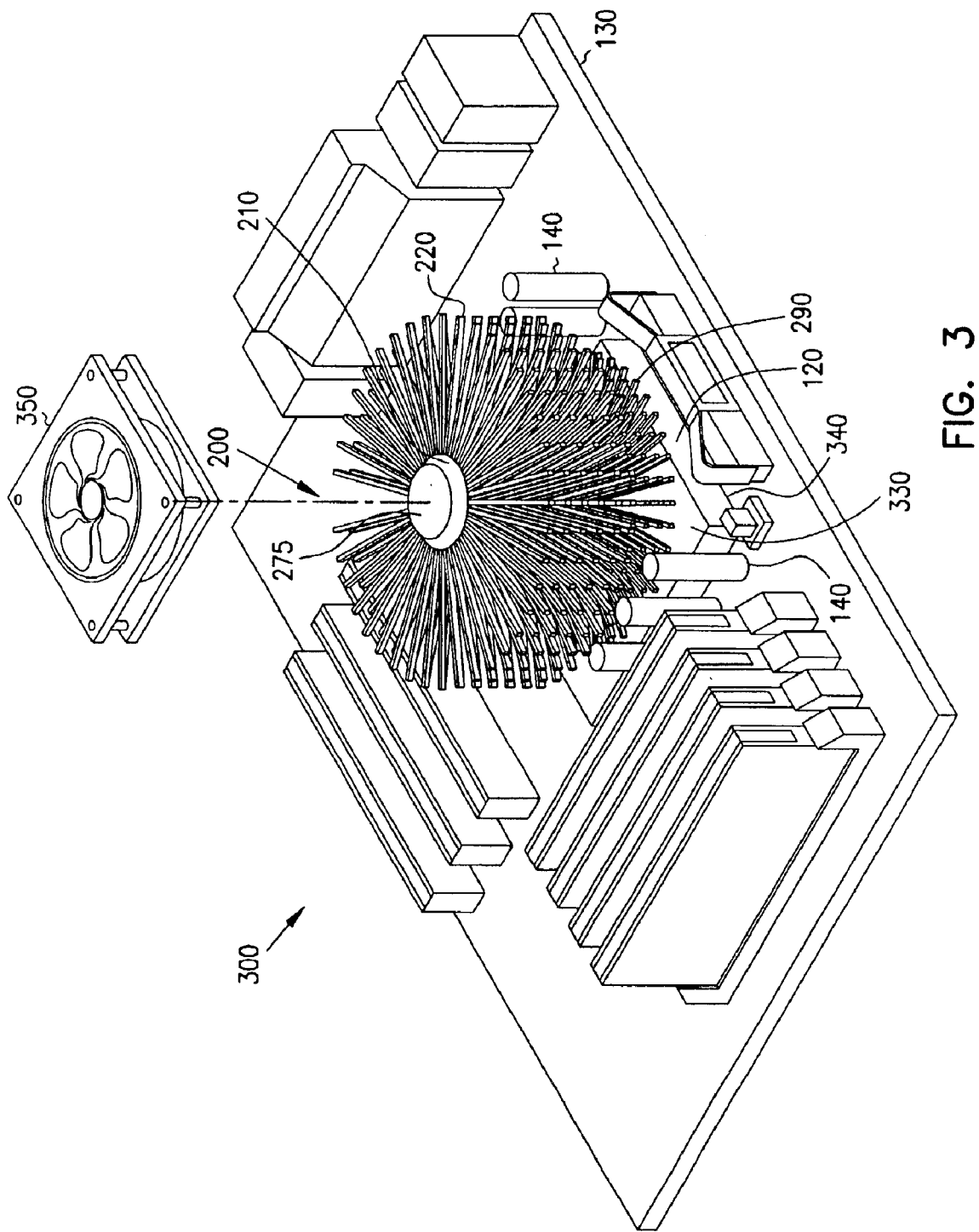
FIG. 3 is an isometric view showing the enhanced heat dissipation device of FIG. 2 attached to a microprocessor on an assembled motherboard.

FIG. 3 is an isometric view 300 showing the enhanced heat dissipation device 200 shown in FIG. 2, attached to the microprocessor 120 on an assembled motherboard 130. In the example embodiment shown in FIG. 3, the microprocessor 120 has a front side 340 and a back side 330. The front side 340 is disposed across from the back side 330. The front side 340 is attached to the assembled motherboard 130 that has components such as low-cost capacitors 140 and other such electrical components. The base 270 shown in FIG. 2, of the enhanced heat dissipation device 200, is attached to the back side 330 of the microprocessor 120. It can be seen from FIG. 3 that the first and second arrays 220 and 290 are of sufficient size so as to allow low-cost capacitors 140 mounted on the assembled board 130 to encroach around the microprocessor 120. It can also be seen that the low-cost capacitors 140 are below the first array 220 and around the second array 290.

Also, it can be seen in FIG. 3 that the first array 220 is larger than the second array 290, thereby increasing the heat dissipation rate without increasing a footprint size of the base 270 of the heat dissipation device 200 any more than the back side 330 of the microprocessor 120. The coinciding footprint sizes of the base 270 of the heat dissipation device 200 and the back side 330 of the microprocessor 120 enables the base 270 and the back side 330 of the microprocessor 120 to have the same heat transfer rates. This in turn increases the efficiency of heat transfer between the base 270 and the back side 330 of the microprocessor 120.

The core 210 further has a top surface 275 disposed across from the base 270. In some embodiments, the top surface 275 is perpendicular to the axis 260 and is in close proximity to the first array 220. A heat transport medium 350 such as a fan can be attached to the top surface 275 to introduce a heat transfer medium 297 such as air in a direction shown in FIG. 2. This creates an omni-directional flow around the core 210 and the first and second arrays 220 and 290 to enhance heat dissipation by the heat dissipation device 200. A heat transport medium 295 (refer to FIG. 2) such as a heat pipe or other such medium can be included in the core 210 to further enhance the heat transfer from the heat dissipation device 200.

In some embodiments, the enhanced heat dissipation device 200 is made of thermally conductive materials such as copper, aluminum, or any other such material capable of extracting heat away from the integrated circuit device. In some embodiments, the core 210 can include heat transport mediums such as one or more heat pipes, a liquid, a thermo-siphon, or other similar heat transport medium suitable for enhancing the extraction of heat from the integrated circuit device. In some embodiments, the first and second arrays 220 and 290 occupy a first and second volume of space, respectively, around the upper and lower surface areas 230 and 240 such that the second volume is less than the first volume to permit components to be mounted on the circuit board 130 and below the first array 220.

Figure 4:
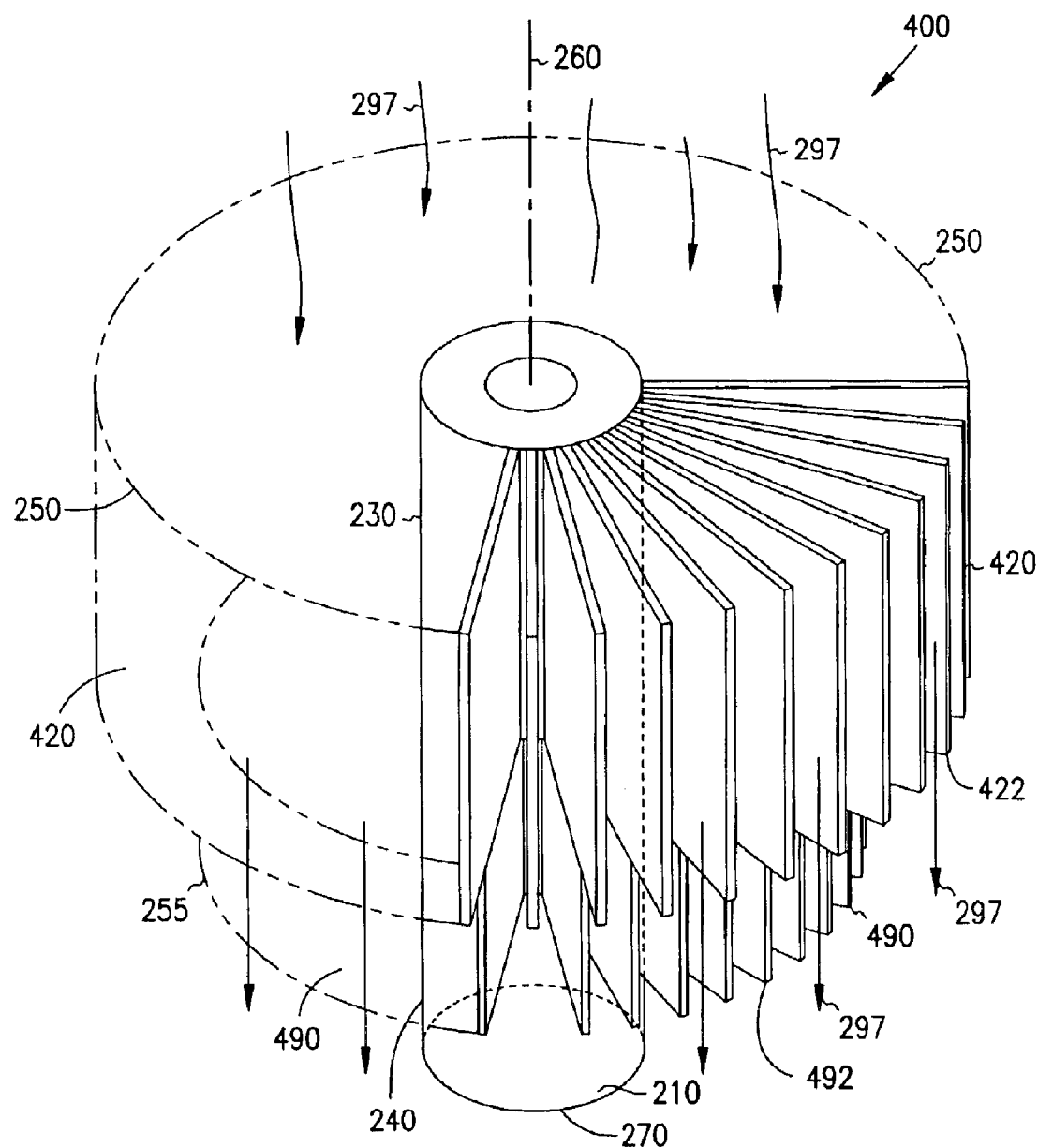
FIG. 4 is an isometric view of another embodiment of an enhanced heat dissipation device according to the present invention.

FIG. 4 is an isometric view of another embodiment of the enhanced heat dissipation device 400 according to the present invention. Shown in FIG. 4 is the enhanced heat dissipation device 400 including the thermally conductive core 210, and a first array 420 of radially extending substantially planar fin structures 422. Also, shown in FIG. 4 is the core 210 having the upper and lower outer surface areas 230 and 240. The first array 420 is thermally coupled to the upper surface area 230 of the core 210 such that a cooling medium such as air introduced around the upper and lower surface areas 230 and 240 of the core 210 and the first array 420, creates a flow that is substantially parallel to the upper and lower surface areas 230 and 240 and the first array 420 to enhance heat dissipation from the heat dissipation device 400. FIG. 4 further shows an optional second array 490 of radially extending substantially planar fin structures 492 thermally coupled to the lower surface area 240 of the core 210 such that the cooling medium introduced around the first and second arrays 420 and 490 creates a flow that is substantially parallel to the upper and lower surface areas 230 and 240 and the first and second arrays 420 and 490.

The core 210 has an axis 260. The substantially planar fin structures 422 and 492 of the first and second arrays 420 and 490, respectively, are thermally coupled to the upper and lower surface areas 230 and 240, respectively, such that they are substantially parallel to the axis 260 so that the cooling medium introduced around the core 210 and the first and second arrays 420 and 490, creates a flow substantially parallel to the axis 260 to enhance heat dissipation from the heat dissipation device 400. In some embodiments, the first and second arrays 420 and 490 including the substantially planar fin structures 422 and 492 are aligned and thermally coupled so that they form a single array as shown in FIG. 4. In some embodiments, the upper and lower surface areas 230 and 240 are parallel to the axis 260. The core 260 further has a base 270. In some embodiments, the base 270 is disposed in such a way that it is in close proximity to the lower surface area 240 and perpendicular to the axis 260. The upper and lower surface areas 230 and 240 can be concentric to the axis 260.

The first array 420 is thermally coupled to the upper surface area 230 such that components can be mounted around and in close proximity to the lower surface area 240 and below the first array 420 when the heat dissipation device 400 is mounted onto an integrated circuit device. In some embodiments, the components can encroach onto the integrated circuit device without mechanically interfering with the heat dissipation device 400.

The core 210 can be a solid body. The solid body can be cylindrical, conical, square, rectangular, or any other similar shape that facilitates in mounting onto the integrated circuit device and in attaching the first array 420 to the upper surface area 230. The core 210 can include heat transport mediums such as one or more heat pipes, a liquid, a thermo-siphon, or other such heat transport medium that enhances heat dissipation from the integrated circuit device.

The first array 420 has the first outer diameter 250 and the second array 490 has the second outer diameter 255. The second outer diameter 255 is less than the first outer diameter 250. The first array 420 has a first depth, and the second array 490 has a second depth. The first and second outer diameters 250 and 255, including the first and second depths, are of sufficient size to allow components to be mounted around and in close proximity to the integrated circuit device when the heat dissipation device 400 is mounted on the integrated circuit device.

The second array 490 is thermally coupled to the lower core area 240 of the core 210 such that the cooling medium introduced creates an omni-directional flow around the upper and lower surface areas 230 and 240 of the core 210 and the first and second arrays 420 and 490 to enhance heat dissipation from the heat dissipation device 400. The heat dissipation device 400, including the core 210 and the first and second arrays 420 and 490, can be made from materials such as aluminum, copper, or any other materials that are capable of dissipating heat away from the integrated circuit device. The first and second arrays 420 and 490 can be formed to have outer shapes such as circular, square, rectangular, elliptical, conical or any other shape suitable for allowing components to encroach around and in close proximity to the first and second arrays 420 and 490.

Figure 5:
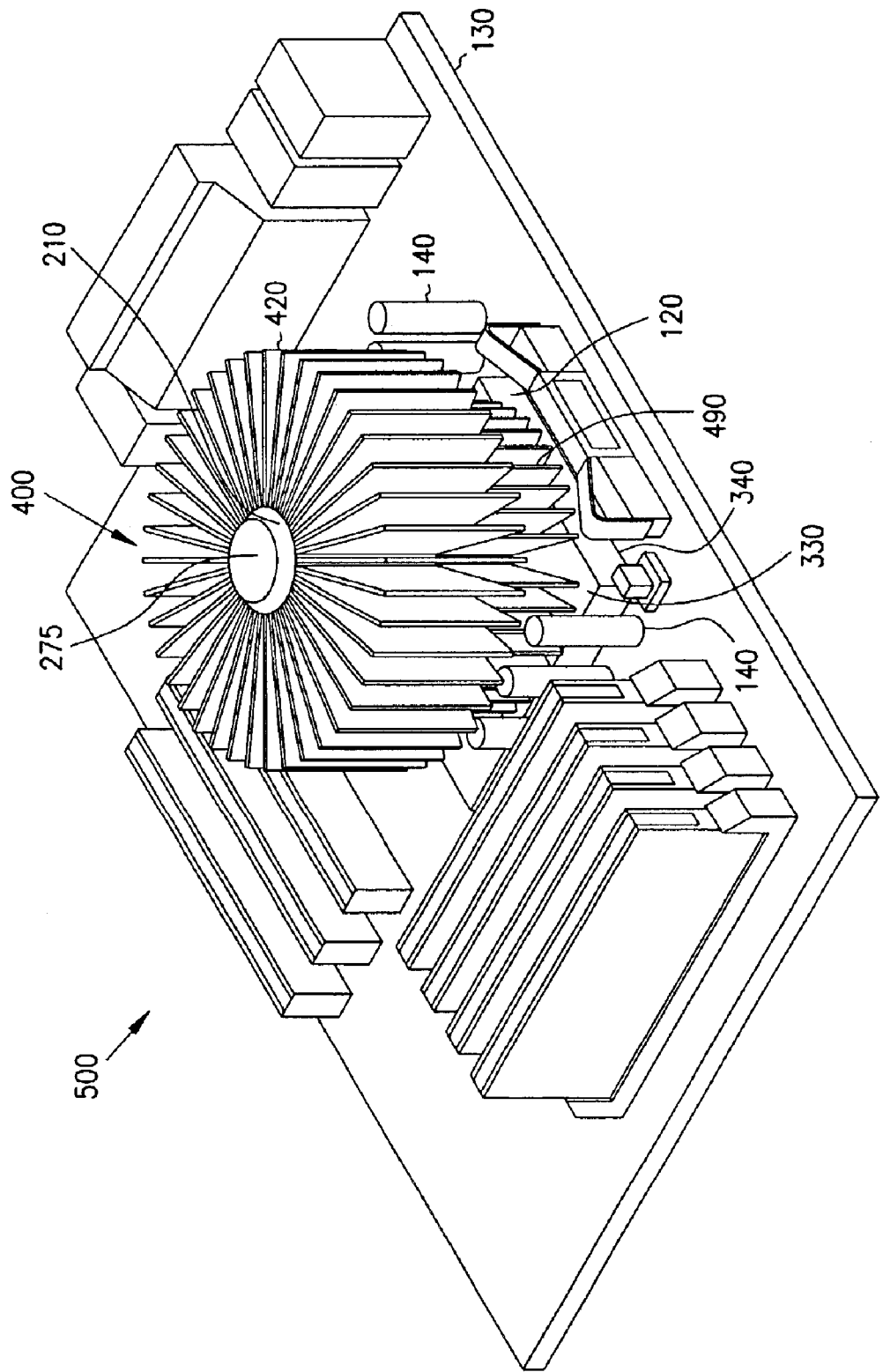
FIG. 5 is an isometric view showing the enhanced heat dissipation device of FIG. 4 attached to a microprocessor on an assembled motherboard.

FIG. 5 is an isometric view 500 showing the enhanced heat dissipation device 400 shown in FIG. 4 attached to the microprocessor 120 on the assembled motherboard 130. In the example embodiment shown in FIG. 5, the microprocessor 120 has a front side 340 and a back side 330. The front side 340 is disposed across from the back side 330. The front side 340 is attached to the assembled motherboard 130 having components such as low-cost capacitors 140 and other such electrical components. The base 270, shown in FIG. 4, of the enhanced heat dissipation device 400 is attached to the back side 330 of the microprocessor 120. It can be seen from FIG. 5 that the first and second arrays 420 and 490 are of sufficient size so as to allow low-cost capacitors 140 mounted on the assembled board 130 to encroach around the microprocessor 120. It can also be seen that low-cost capacitors 140 are below the first array 420 and around the second array 490.

Also, it can be seen in FIG. 5 that the first array 420 is larger than the second array 490, thereby increasing the heat dissipation rate without increasing a footprint size of the base 270 (refer to FIG. 4) of the heat dissipation device 400 any more than the back side 330 of the microprocessor 120. The coinciding footprint sizes of the base 270 of the heat dissipation device 400 and the back side 330 of the microprocessor 120 enables the base 270 and the back side 330 of the microprocessor 120 to have the same heat transfer rates. This in turn increases the efficiency of heat transfer between the base 270 and the back side 330 of the microprocessor 120.

The core 210 further has the top surface 275 disposed across from the base 270 (refer to FIG. 4). In some embodiments, the top surface 275 is perpendicular to the axis 260 (refer to FIG. 4) and is in close proximity to the first array 420. A heat transport medium can be attached to the top surface 275 to introduce a heat transfer medium 297 such as air in a direction shown in FIG. 2, to create a flow around the core 210 and the first and second arrays 420 and 490 that is substantially parallel to the core 210 and the first and second arrays 420 and 490 to enhance the heat dissipation by the heat dissipation device 400. A heat transport medium 295 (refer to FIG. 2) such as a heat pipe or other such medium can be included in the core 210 to further enhance the heat transfer from the heat dissipation device 400.

In some embodiments, the enhanced heat dissipation device 400 is made of thremally conductive materials such as copper, aluminum, or any other such material capable of extracting heat away from the integrated circuit device. In some embodiments, the core 210 can include heat transport mediums such as one or more heat pipes, a liquid, a thermo-siphon, or other similar heat transport medium suitable for enhancing the extraction of heat from the integrated circuit device. In some embodiments, the first and second arrays 420 and 490 occupy a first and second volume of space around the upper and lower surface areas 230 and 240, respectively, such that the second volume is less than the first volume to permit components to be mounted on the circuit board 130 and below the first array 420.

Figure 6:
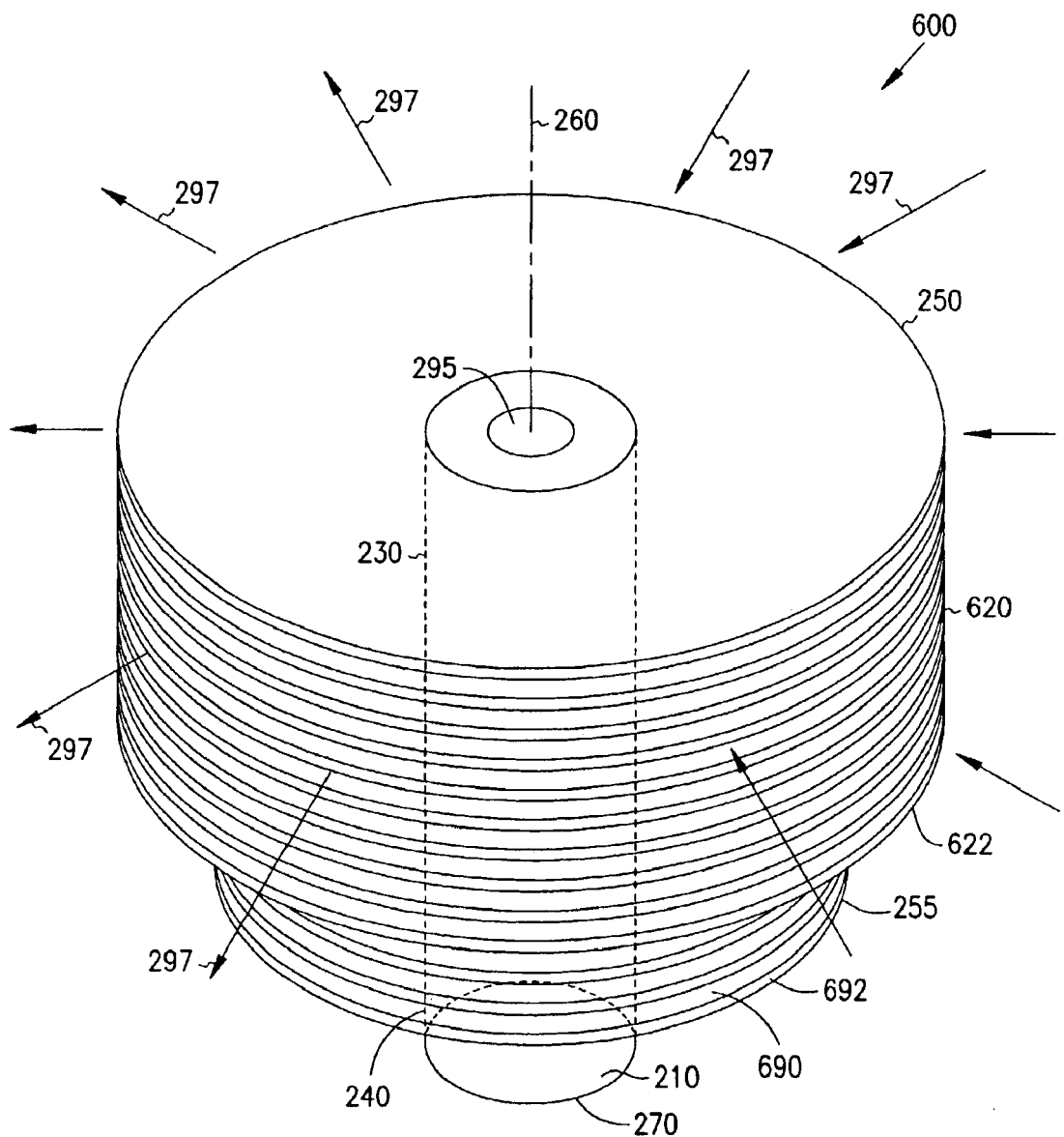
FIG. 6 is an isometric view of another embodiment of an enhanced heat dissipation device according to the present invention.

FIG. 6 is an isometric view of another embodiment of the enhanced heat dissipation device 600 according to the present invention. Shown in FIG. 6 is the enhanced heat dissipation device 600 including the thermally conductive core 210, and a first array 620 of radially extending substantially planar fin structures 622. Also, shown in FIG. 6 is the core 210 having upper and lower outer surface areas 230 and 240. The first array 620 is thermally coupled to the upper core area 230 of the core 210 such that a cooling medium 297 such as air introduced around the upper and lower surface areas 230 and 240 of the core 210 and the first array 620 creates a flow that is substantially perpendicular to the core 210 to enhance heat dissipation from the heat dissipation device 600. FIG. 6 further shows an optional second array 690 of radially extending substantially planar fin structures 692 thermally coupled to the lower core area 240 of the core 210 such that the cooling medium 297 introduced around the first and second arrays 620 and 690 creates a flow that is substantially perpendicular to the core 210 to further enhance heat dissipation from the heat dissipation device 600.

The core 210 has an axis 260. In some embodiments, the upper and lower surface areas 230 and 240 are parallel to the axis 260. The core 210 further has a base 270. In some embodiments, the base 270 is disposed in such a way that it is in close proximity to the lower surface area 240 and is perpendicular to the axis 260. The upper and lower surface areas 230 and 240 can be concentric to the axis 260.

The first array 620 is thermally coupled to the upper surface area 230 such that components can be mounted around and in close proximity to the lower surface area 240 and below the first array 620 when the heat dissipation device 600 is mounted onto the integrated circuit device. In some embodiments, the components can encroach onto the integrated circuit device without mechanically interfering with the heat dissipation device 600.

The core 210 can be a solid body. The solid body can be cylindrical, conical, square, rectangular, or any other similar shape that facilitates in mounting onto the integrated circuit device and in attaching the first array 620 to the upper surface area 230. The core 210 can include a heat transport medium 295 such as one or more heat pipes, a liquid, a thermo-siphon, or other such heat transport medium that enhance heat dissipation from the integrated circuit device.

The first array 620 has a first outer diameter 250, and the second array 690 has a second outer diameter 255. The second outer diameter 255 is less than the first outer diameter 250. The first array 620 has a first depth, and the second array 690 has a second depth. The first and second outer diameters 250 and 255, including the first and second depths, are of sufficient size to allow components to be mounted around and in close proximity to the integrated circuit device when the device is mounted on the integrated circuit device.

The second array 690 is thermally coupled to the lower core area 240 of the core 210 such that the cooling medium 297 introduced creates an omni-directional flow around the upper and lower surface areas 230 and 240 of the core 210 and the first and second arrays 620 and 690 to enhance heat dissipation from the device 600. The device 600, including the core 210 and the first and second arrays 620 and 690, can be made from materials such as aluminum, copper, or any other materials that are capable of dissipating heat away from the integrated circuit device. The first and second arrays 620 and 690 can be formed to have outer shapes such as circular, square, rectangular, elliptical, conical or any other shape suitable for allowing components to encroach around and in close proximity to the first and second arrays 620 and 690.

Figure 7:
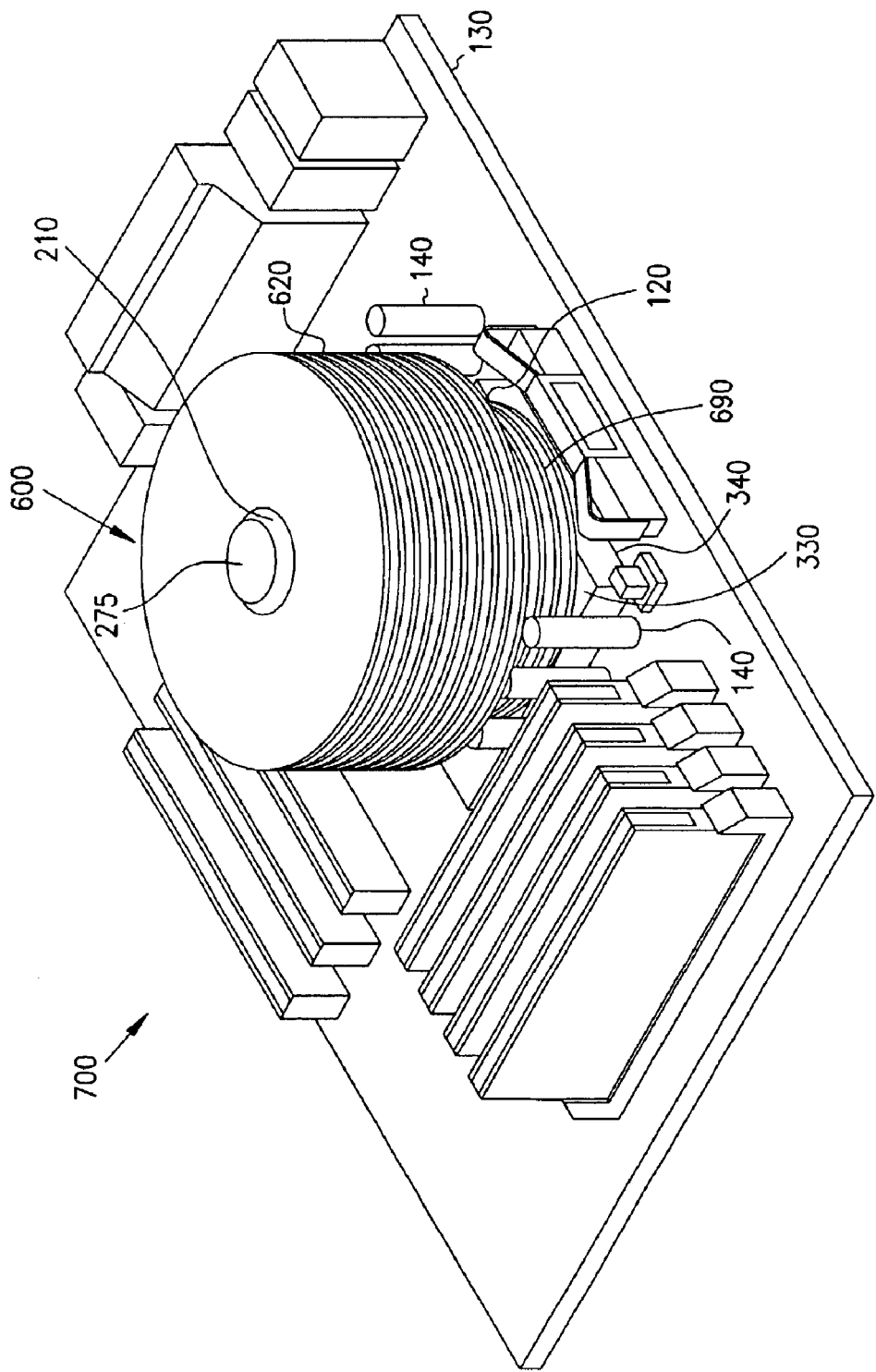
FIG. 7 is an isometric view showing the enhanced heat dissipation device of FIG. 6 attached to a microprocessor on an assembled motherboard.

FIG. 7 is an isometric view 700 showing the enhanced heat dissipation device 600 shown in FIG. 6, attached to the microprocessor 120 on an assembled motherboard 130. In the example embodiment shown in FIG. 7, the microprocessor 120 has a front side 340 and a back side 330. The front side 340 is disposed across from the back side 330. The front side 340 is attached to the assembled motherboard 130 that has components such as low-cost capacitors 140 and other such electrical components. The base 270, shown in FIG. 6, of the enhanced heat dissipation device 600 is attached to the back side 330 of the microprocessor 120. It can be seen from FIG. 7 that the first and second arrays 620 and 690 are of sufficient size so as to allow low-cost capacitors 140 mounted on the assembled board 130 to encroach around the microprocessor 120. It can also be seen that low-cost capacitors 140 are below the first array 620 and around the second array 690.

Also, it can be seen in FIG. 7 that the first array 620 is larger than the second array 690, thereby increasing the heat dissipation rate without increasing the footprint size of the base 270 (refer to FIG. 6) of the heat dissipation device 600 any more than the back side 330 of the microprocessor 120. The coinciding footprint sizes of the base 270 of the heat dissipation device 600 and the back side 330 of the microprocessor 120 enables the base 270 and the back side 330 of the microprocessor 120 to have the same heat transfer rates. This in turn increases the efficiency of heat transfer between the base 270 and the back side 330 of the microprocessor 120.

A heat transport medium can be disposed around the heat dissipation device 600 to introduce a heat transfer medium 297 such as air in a direction shown in FIG. 6, to create a flow that is substantially perpendicular to the core 210. Further, the flow is substantially parallel to the first and second arrays 620 and 690 to enhance the heat dissipation by the heat dissipation device 600. A heat transport medium 295 such as a heat pipe, or other such medium can be included in the core 210 to further enhance the heat transfer from the heat dissipation device 600.

In some embodiments, the enhanced heat dissipation device 600 is made of thermally conductive materials such as copper, aluminum, or any other such material capable of extracting heat away from the integrated circuit device. In some embodiments, the core 210 can include a heat transport medium 295 such as one or more heat pipes, a liquid, a thermo-siphon, or other similar heat transport medium suitable for enhancing the extraction of heat from the integrated circuit device. In some embodiments, the first and second arrays 620 and 690 occupy a first and second volume of space around the upper and lower surface areas 230 and 240, respectively, such that the second volume is less than the first volume to permit components to be mounted on the circuit board 130 and below the first array 620.

Figure 8:
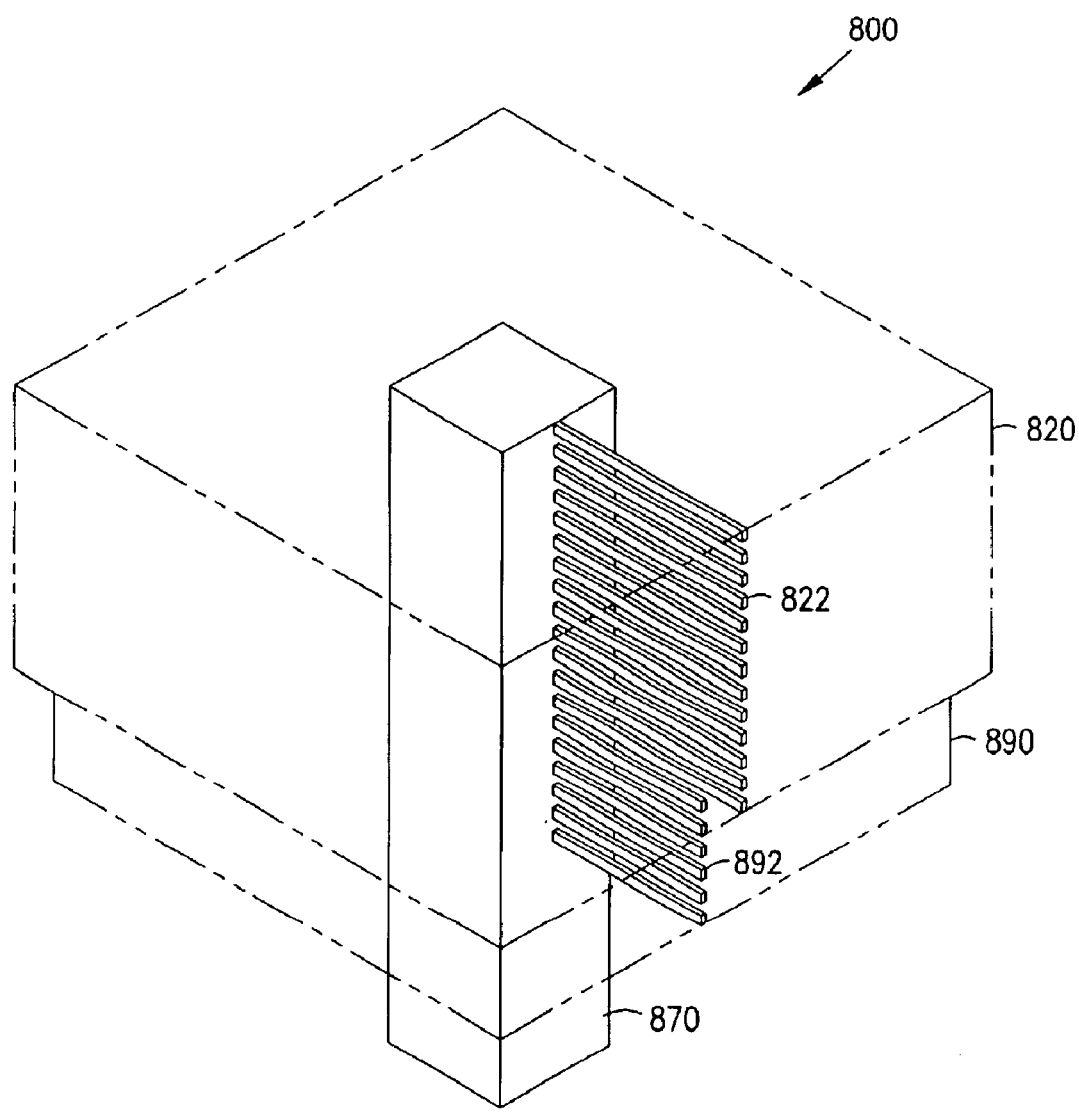
FIG. 8 is an isometric view of another embodiment of an enhanced heat dissipation device according to the present invention.

FIG. 8 is an isometric view of another embodiment of an enhanced heat dissipation device 800 according to the present invention. Heat dissipation device 800 comprises a core 870 whose cross-section has the shape of a square. Heat dissipation device 800 further comprises a first array 820 of pin fin structures 822 and a second array 890 of pin fin structures 892. In the embodiment shown, the first array 820 and the second array 890 have an outer shape that is square. The volume occupied by the second array 890 is less than that occupied by the first array 820.

Figure 9:
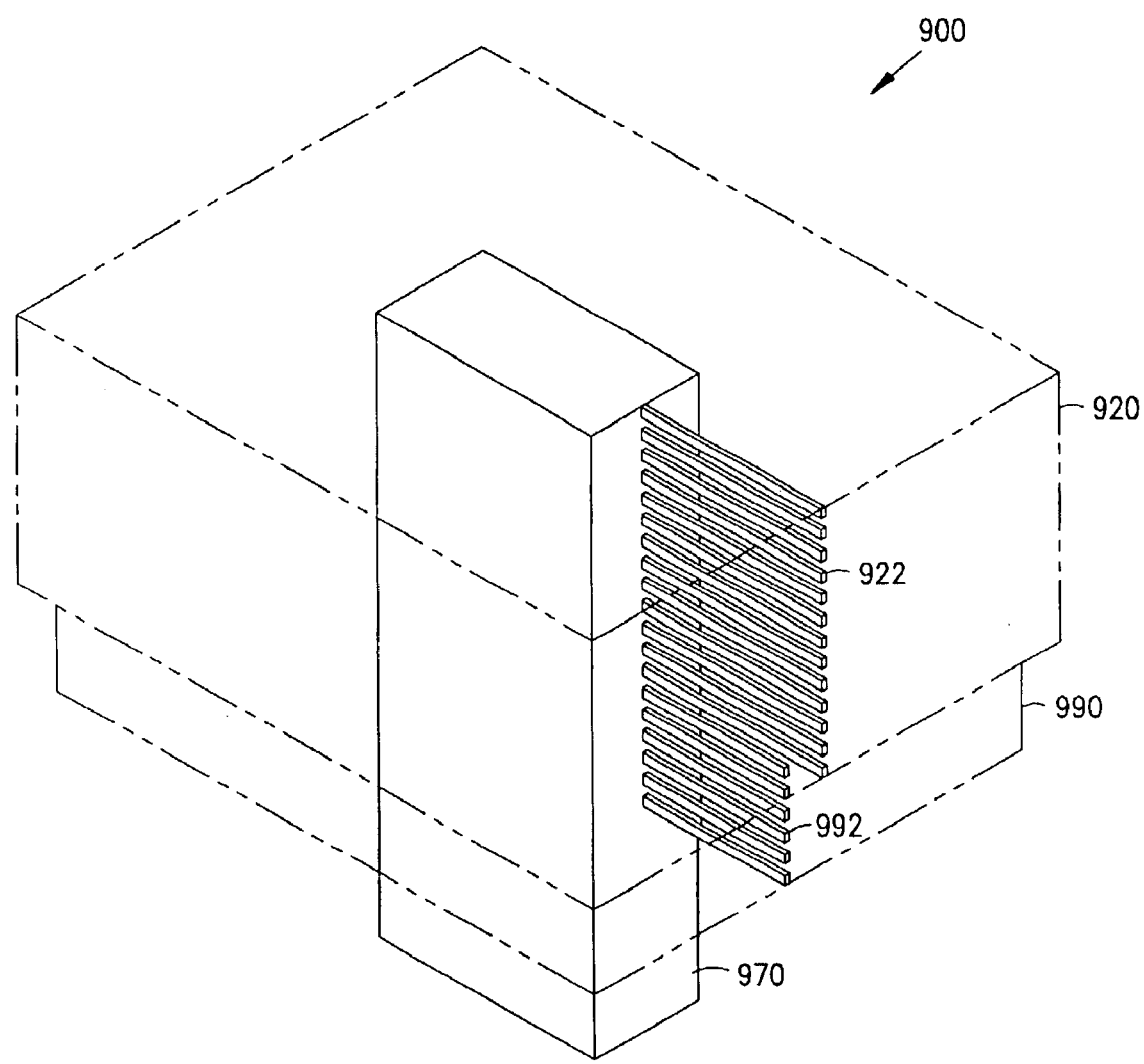
FIG. 9 is an isometric view of another embodiment of an enhanced heat dissipation device according to the present invention.

FIG. 9 is an isometric view of another embodiment of an enhanced heat dissipation device 900 according to the present invention. Heat dissipation device 900 comprises a core 970 whose cross-section has the shape of a rectangle. Heat dissipation device 900 further comprises a first array 920 of pin fin structures 922 and a second array 990 of pin fin structures 992. In the embodiment shown, the first array 920 and the second array 990 have an outer shape that is rectangular. The volume occupied by the second array 990 is less than that occupied by the first array 920.

Figure 10:
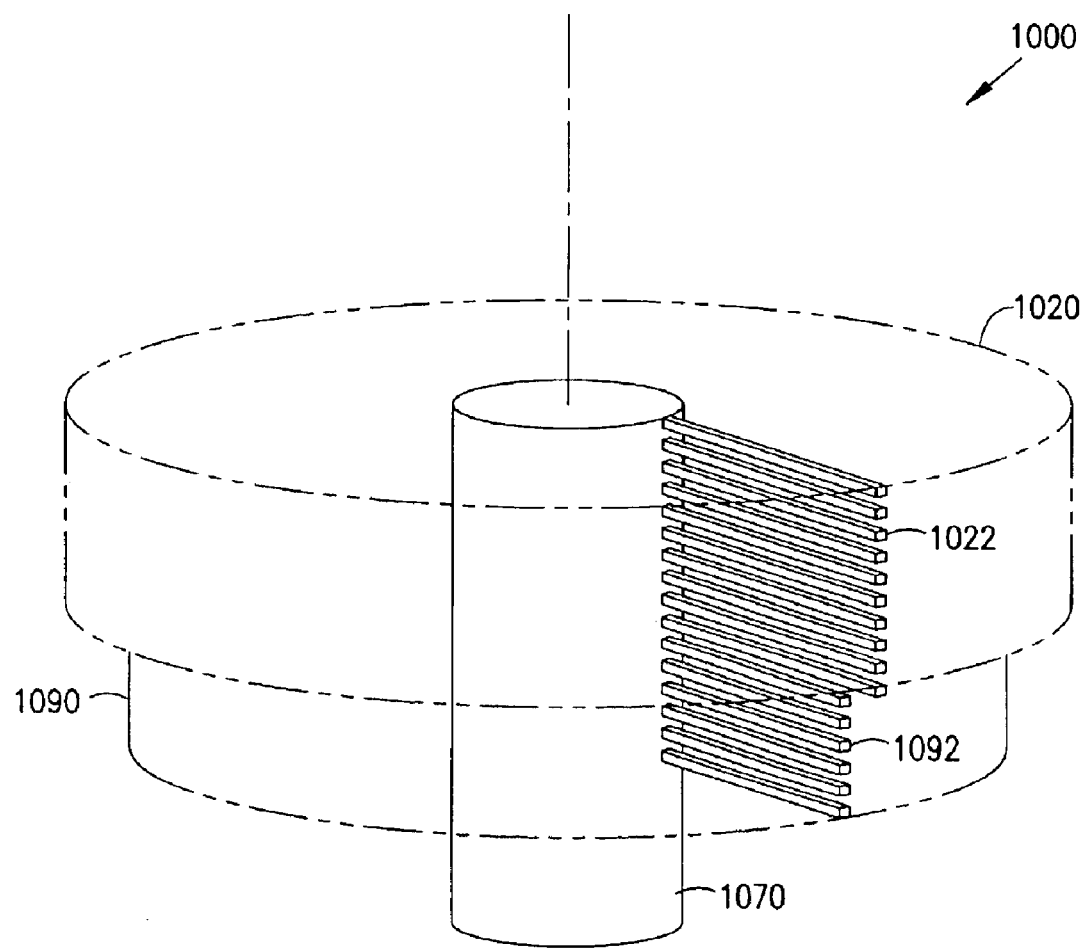
FIG. 10 is an isometric view of another embodiment of an enhanced heat dissipation device according to the present invention.

FIG. 10 is an isometric view of another embodiment of an enhanced heat dissipation device 1000 according to the present invention. Heat dissipation device 1000 comprises a cylindrical core 1070. Heat dissipation device 1000 further comprises a first array 1020 of pin fin structures 1022 and a second array 1090 of pin fin structures 1092. In the embodiment shown, the first array 1020 and the second array 1090 have an outer shape that is elliptical. The volume occupied by the second array 1090 is less than that occupied by the first array 1020.

Figure 11:
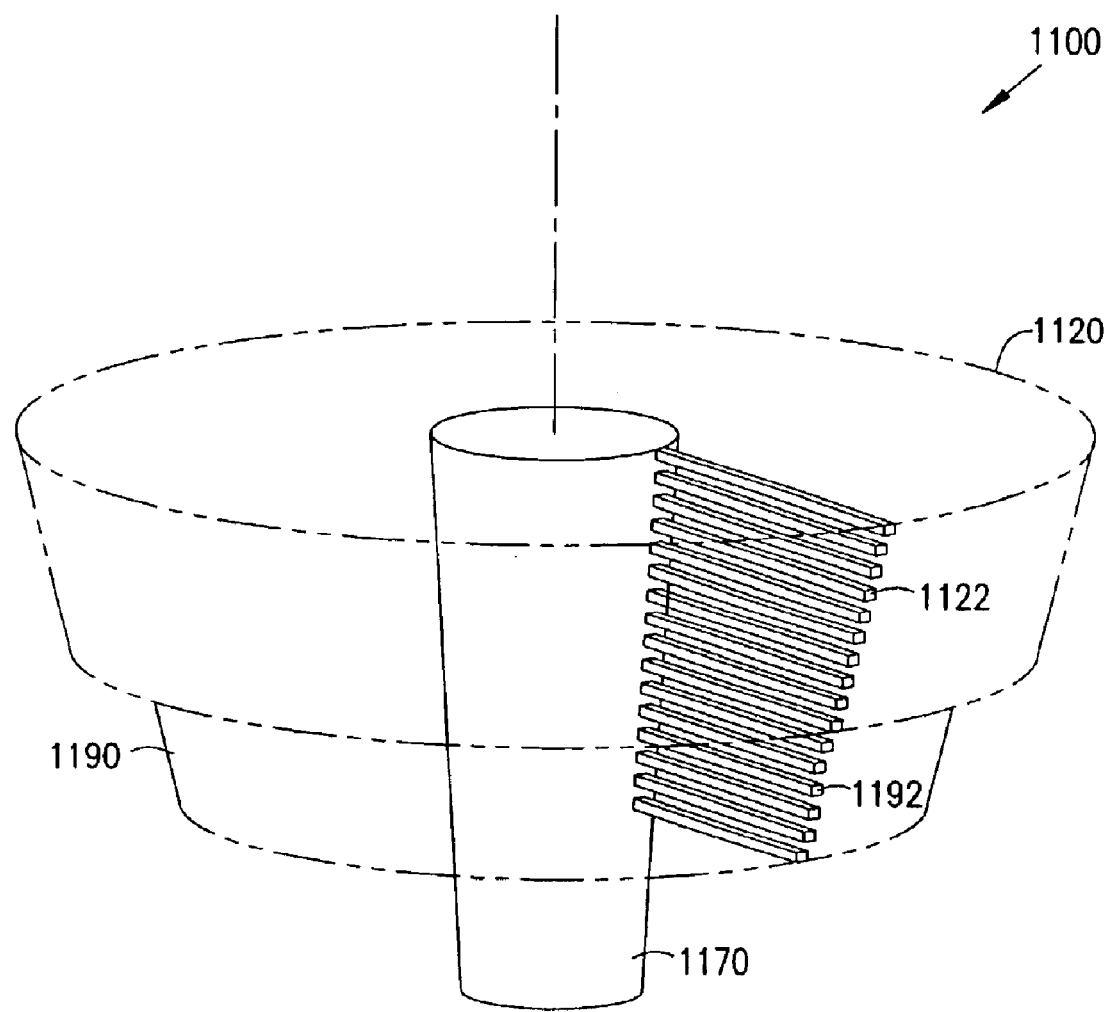
FIG. 11 is an isometric view of another embodiment of an enhanced heat dissipation device according to the present invention.

FIG. 11 is an isometric view of another embodiment of an enhanced heat dissipation device 1100 according to the present invention. Heat dissipation device 1100 comprises a conically-shaped core 1170. Heat dissipation device 1100 further comprises a first array 1120 of pin fin structures 1122 and a second array 1190 of pin fin structures 1192. In the embodiment shown, the first array 1120 and the second array 1190 have an outer shape that is conical. The volume occupied by the second array 1190 is less than that occupied by the first array 1120.

Figure 12:
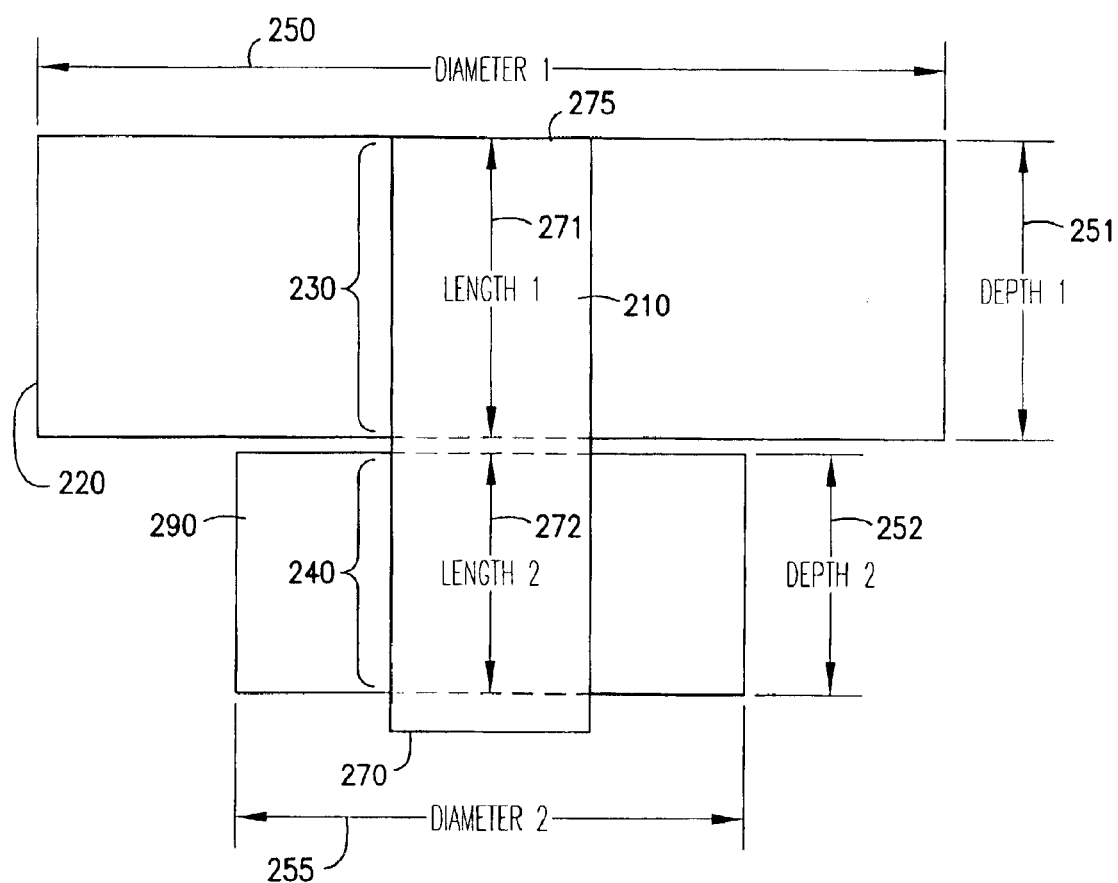
FIG. 12 is a diagrammatic view illustrating certain geometrical relationships among elements of an embodiment of the invention.

FIG. 12 is a diagrammatic view illustrating certain geometrical relationships among elements of an embodiment of the invention such as, for example, the embodiment illustrated in FIG. 2.

A core 210 has a base 270 and a top surface 275.

A first array whose general outline is represented by 220 has a first outer diameter 250 and a first depth 251.

A second array 290 whose general outline is represented by 290 has a second outer diameter 255 and a second depth 252.

Core 210 comprises an upper outer surface area 230 having a first length 271 extending from top surface 275 to the lower edge of the first array 220. The first array 220 is coupled to the upper outer surface area 230 of the core 210.

Core 210 also comprises a lower outer surface area 240 having a second length 272 extending from below the lower edge of the first array 220 to the lower edge of the second array 290. The second array 290 is coupled to the lower outer surface area 240 of the core 210.

CONCLUSION

The above-described device and method provide, among other things, enhanced heat dissipation by using an array of radially extending fin structures where possible. This allows electronic components to encroach around an integrated circuit device on which it is mounted, while maintaining high performance and cost effectiveness by leveraging currently enabled high volume manufacturing techniques.

What is claimed is:

1. An article comprising:
   a thermally conductive core extending upwardly from a heat producing device mounted on a substrate;
   a first array of fin structures extending radially outwardly from an upper portion of the core to define a first cross-sectional shape; and
   a second array of fin structures extending radially outwardly from a lower portion of the core to define a second cross-sectional shape, wherein the area of the second cross-sectional shape is less than the area of the first cross-sectional shape and wherein the second cross-sectional shape is sized to provide sufficient clearance for components mounted on the substrate around and in close proximity to the second array of fin structures and extending within a perimeter of the first cross-sectional shape.

2. The article of claim 1, wherein the fin structures are oriented substantially parallel to the substrate.

3. The article of claim 1, wherein the cross-sectional shape of at least one of the first and second arrays has a shape selected from the group consisting of round, square, rectangular and elliptical shapes.

4. The article of claim 1, wherein a cross-sectional shape of the core is selected from the group consisting of cylindrical, conical, square, and rectangular shapes.

5. The article of claim 1, wherein the core includes a heat transport medium selected from the group consisting of heat pipes, liquids and thermo-siphons.

6. The article of claim 1, wherein the fins of at least one of the first and second arrays of fin structures are substantially planar and oriented with the surface of their planes substantially perpendicular to the substrate.

7. The article of claim 1, wherein the fins of at least one of the first and second arrays of fin structures are substantially planar and oriented with the surface of their planes substantially parallel to the substrate.

8. The article of claim 1, wherein at least one of the core and the first and second arrays are formed from materials selected from the group consisting of aluminum and copper.

9. A system comprising:
   a heat producing device mounted on a circuit board having outwardly projecting components mounted thereon; and
   a heat dissipation device including
   a thermally conductive core coupled to and extending upwardly from the heat producing device;
   a first array of fin structures extending radially outwardly from an upper portion of the core to define a first cross-sectional shape; and
   a second array of fin structures extending radially outwardly from a lower portion of the core to define a second cross-sectional shape, wherein the area of the second cross-sectional shape is less than the area of the first cross-sectional shape and wherein the second cross-sectional shape is sized to provide sufficient clearance for components mounted on the circuit board around and in close proximity to the second array of fin structures and extending within a perimeter of the first cross-sectional shape.

10. The system of claim 9, wherein second array of fin structures is in close proximity to the lower outer surface area, and wherein the surface of the heat producing device integrated circuit device and the cross sectional shape of the base have coinciding footprint.

11. The system of claim 9, wherein the core further comprises a heat transport medium to be coupled to heat producing device.

12. The heat dissipation system of claim 9, wherein the heat producing device is an integrated circuit device.

* * * * *

UNITED STATES PATENT AND TRADEMARK OFFICE
CERTIFICATE OF CORRECTION

PATENT NO. : 6,845,010 B2
DATED : January 18, 2005
INVENTOR(S) : Lee

It is certified that error appears in the above-identified patent and that said Letters Patent is hereby corrected as shown below:

<u>Column 12,</u>
Line 14, delete "cross sectional" and insert -- cross-sectional --, therefor.

Signed and Sealed this

Thirteenth Day of September, 2005

JON W. DUDAS
*Director of the United States Patent and Trademark Office*